(12) United States Patent
Kim et al.

(10) Patent No.: US 9,552,992 B2
(45) Date of Patent: Jan. 24, 2017

(54) CO-FABRICATION OF NON-PLANAR SEMICONDUCTOR DEVICES HAVING DIFFERENT THRESHOLD VOLTAGES

(71) Applicant: GLOBALFOUNDRIES Inc., Grand Cayman (KY)

(72) Inventors: Hoon Kim, Clifton Park, NY (US); Min-Gyu Sung, Latham, NY (US); Chanro Park, Clifton Park, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/634,483

(22) Filed: Feb. 27, 2015

(65) Prior Publication Data

US 2016/0254158 A1    Sep. 1, 2016

(51) Int. Cl.
*H01L 21/28* (2006.01)
*H01L 29/40* (2006.01)
*H01L 21/02* (2006.01)

(52) U.S. Cl.
CPC ... *H01L 21/28158* (2013.01); *H01L 21/02181* (2013.01); *H01L 29/401* (2013.01)

(58) Field of Classification Search
CPC .... H01L 29/517; H01L 29/513; H01L 29/518; H01L 21/28202; H01L 21/28185

USPC .......................................................... 438/591
See application file for complete search history.

(56) References Cited

U.S. PATENT DOCUMENTS

| | | | |
|---|---|---|---|
| 8,372,703 B2* | 2/2013 | Kirkpatrick | H01L 21/82384 257/E21.637 |
| 8,536,038 B2* | 9/2013 | Wang | H01L 21/265 438/514 |
| 8,940,626 B2* | 1/2015 | Xie | H01L 27/092 257/331 |
| 9,306,032 B2* | 4/2016 | Lin | H01L 29/66477 |
| 2016/0020104 A1* | 1/2016 | Lin | H01L 21/28088 257/412 |

* cited by examiner

*Primary Examiner* — Quoc Hoang
(74) *Attorney, Agent, or Firm* — Wayne F. Reinke, Esq.; Heslin Rothenberg Farley & Mesiti P.C.

(57) ABSTRACT

Co-fabricating non-planar (i.e., three-dimensional) semiconductor devices with different threshold voltages includes providing a starting semiconductor structure, the structure including a semiconductor substrate, multiple raised semiconductor structures coupled to the substrate, at least two gate structures encompassing a portion of the raised structures, each gate structure including a gate opening lined with dielectric material and partially filled with work function material, a portion of the work function material being recessed. The co-fabrication further includes creating at least one conformal barrier layer in one or more and less than all of the gate openings, filling the gate openings with conductive material, and modifying the work function of at least one and less than all of the filled gate structures.

7 Claims, 3 Drawing Sheets

CO-FABRICATION OF NON-PLANAR SEMICONDUCTOR DEVICES HAVING DIFFERENT THRESHOLD VOLTAGES

BACKGROUND OF THE INVENTION

Technical Field

The present invention generally relates to semiconductor device threshold (or "turn-on") voltage. More particularly, the present invention relates to the co-fabrication of non-planar semiconductor devices with different threshold voltages.

Background Information

Presently, the main approach to co-fabricating non-planar semiconductor devices (i.e., plasma doping) suffers drawbacks. For example, plasma doping can suffer short channel effects, due to the difference in the life time of plasma for short and long channels. Whatever fabrication method is used, it should be simple, repeatable and offer the option of fine-tuning the threshold voltages.

Thus, a need exists for improvement in co-fabricating non-planar semiconductor devices with different threshold voltages.

SUMMARY OF THE INVENTION

The shortcomings of the prior art are overcome and additional advantages are provided through the provision, in one aspect, of a method of co-fabricating semiconductor devices with different threshold voltages. The method includes providing a starting semiconductor structure, the starting semiconductor structure including a semiconductor substrate, a plurality of fins coupled to the substrate, at least two gate structures encompassing a portion of the fins, the at least two gate structures including at least two gate trenches, a conformal dielectric layer covering a bottom and walls of each of the at least two gate trenches, the at least two gate trenches being partially filled over the conformal dielectric layer with work function material, a portion of the work function material being recessed. The method further includes creating at least one conformal barrier layer in one or more and less than all of the gate trenches, filling the gate trenches with conductive material, and prior to the filling, modifying a work function of the work function material, resulting in different work functions for the at least two gate trenches with and without the conformal barrier layer.

These, and other objects, features and advantages of this invention will become apparent from the following detailed description of the various aspects of the invention taken in conjunction with the accompanying drawings.

DETAILED DESCRIPTION OF THE INVENTION

Figure 1:
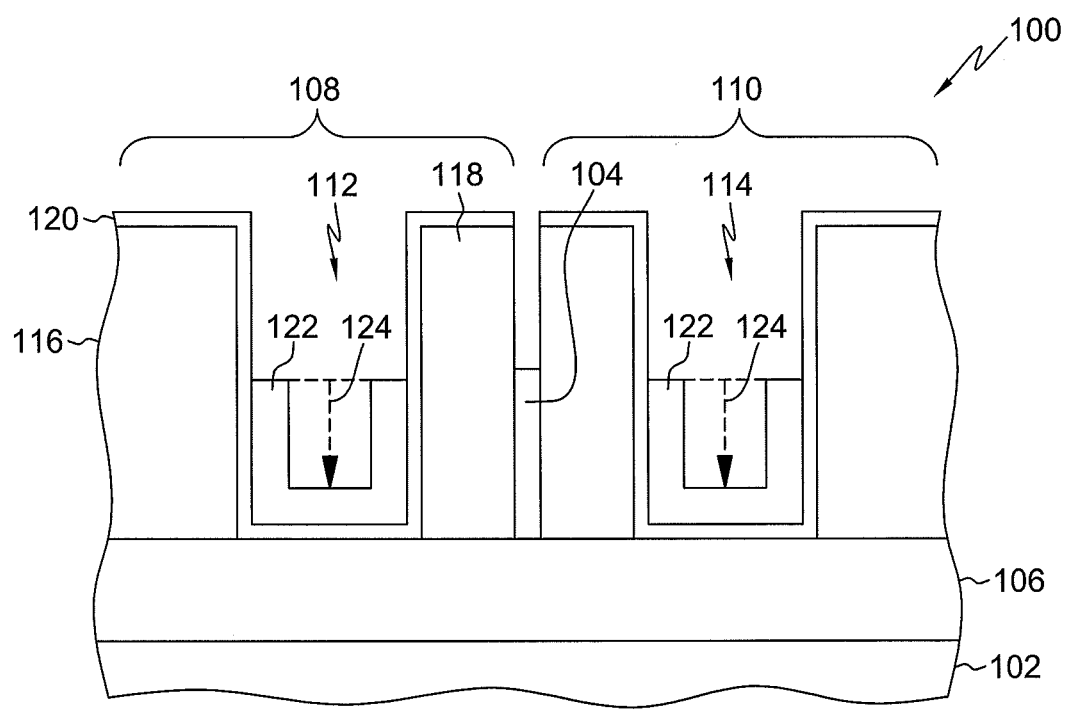
FIG. 1 is a cross-sectional view of one example of a starting three-dimensional semiconductor structure, taken through a raised structure, the starting structure including a semiconductor substrate, one or more raised structures coupled to the substrate, a bottom portion of the raised structure(s) being surrounded by a layer of isolation material, at least two gate structures, each gate structure encompassing a portion of the raised structures, each gate structure including a gate opening defined by spacers and lined with dielectric material (e.g., a high-k dielectric), each gate opening being partially filled with work function material, a portion of the work function material being recessed, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting three-dimensional semiconductor structure 100, taken through partially filled gate structures, the starting structure including a semiconductor substrate 102, one or more raised structures coupled to the substrate (e.g., raised structure 104), a bottom portion of the raised structure(s) being surrounded by a layer 106 of isolation material, at least two gate structures 108 and 110, each gate structure encompassing a portion of the raised structures and including a gate opening or trench (e.g., gate openings 112 and 114, respectively) defined by spacers (e.g., spacers 116 and 118) and lined with dielectric material (120, e.g., a high-k dielectric), each gate opening being partially filled with work function material 122, a portion of the work function material being recessed 124, in accordance with one or more aspects of the present invention.

In one example, gate structures 108 and 110, when filled, will have different work functions, and, therefore, their associated devices will have different threshold (or "turn-on") voltages. In one example, the dielectric lining 120 may include a high-k dielectric (i.e., k>3.9, the dielectric constant of silicon dioxide), such as, for example, hafnium dioxide ($HfO_2$), and may be created using, for example, a conventional deposition process. The work function material may include, for example, one or more n-type work function materials, such as, for example, titanium nitride (TiN) and/or titanium carbide (TiC). The work function layer(s) may be created, for example, using conventional processes and techniques. Partially recessing the work function layer(s) may also be accomplished using, for example, conventional processes and techniques (e.g., using an etching process).

Except where noted, the starting structure may generally be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes at least one raised semiconductor structure 104 (raised with respect to the substrate). In one example, the raised structures may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type. The structure further includes at least two gate structures 108 and 110, each gate structure surrounding a portion of each raised structure.

Figure 2:
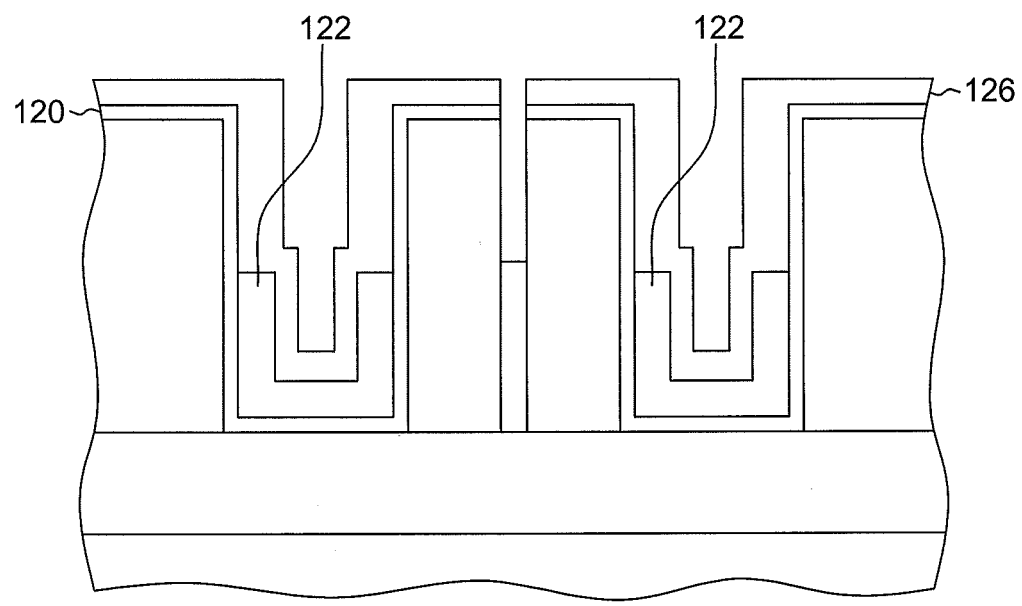
FIG. 2 depicts one example of the three-dimensional structure of FIG. 1 after creating a conformal barrier layer over the liner and work function material, in accordance with one or more aspects of the present invention.

FIG. 2 depicts one example of the three-dimensional structure of FIG. 1 after creating a conformal barrier layer 126 over the liner and work function material, in accordance with one or more aspects of the present invention.

Where the work function material(s) in the gate openings is n-type, the barrier layer may include, for example, an n-type work function material, e.g., titanium carbide (TiC), titanium aluminum carbide (TiAlC), tantalum aluminum carbide (TaAlC), niobium aluminum carbide (NbAlC), tantalum silicide ($TaSi_x$), titanium silicide (TiSi) or hafnium silicide ($HfSi_x$). The barrier layer may be created using, for example, TiC, tantalum carbide (TaC), niobium carbide (NbC), cobalt (Co) or titanium nitride (TiN) with conventional processes and techniques, e.g., a deposition process.

Figure 3:
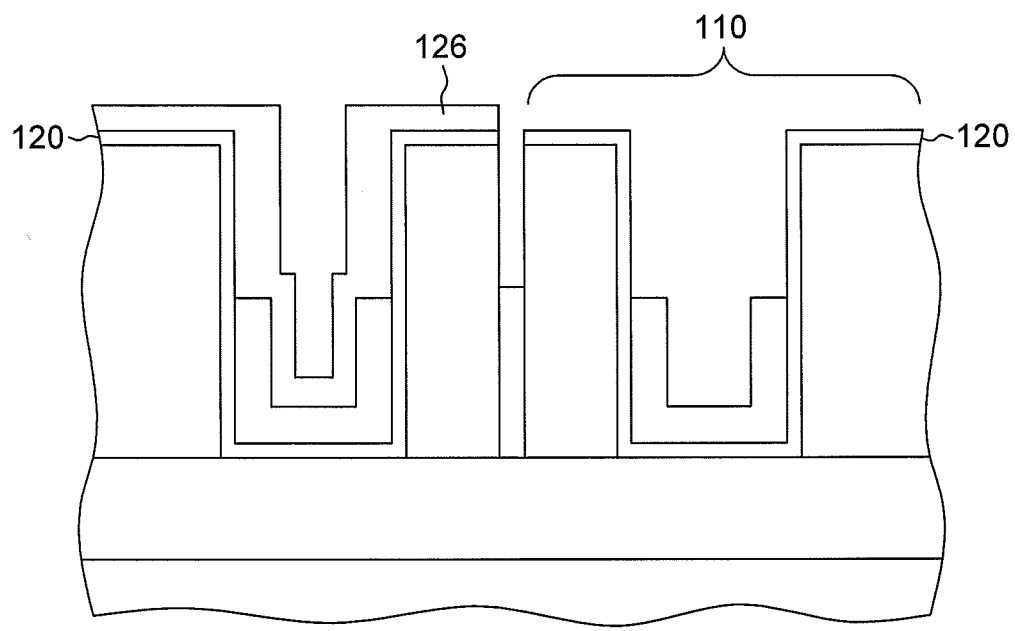
FIG. 3 depicts one example of the three-dimensional structure of FIG. 2 after modifying the work function of at least one and less than all of the gate structures, creating a work function difference between the gate structures for different devices, in accordance with one or more aspects of the present invention.

FIG. 3 depicts one example of the three-dimensional structure of FIG. 2 after modifying the work function of at least one and less than all of the gate structures (here, gate structure 110), creating a work function difference between the gate structures for different devices, resulting in a threshold voltage difference between the devices, in accordance with one or more aspects of the present invention.

In one example, creating the work function difference may include, for example, selectively removing the barrier layer for the at least one and less than all of the gate structures. Selectively removing the barrier layer may include, for example, patterning followed by a selective wet etch. In one example, where the recessed work function material includes at least a top portion of the titanium nitride (TiN), and the barrier layer includes titanium carbide (TiC), a wet etch using, for example, a Standard Clean at 25° C. will result in a much higher etch rate for the TiC as compared to the TiN (e.g., 86.2 A/min for TiC and 0.4 A/min for TiN).

Figure 4:
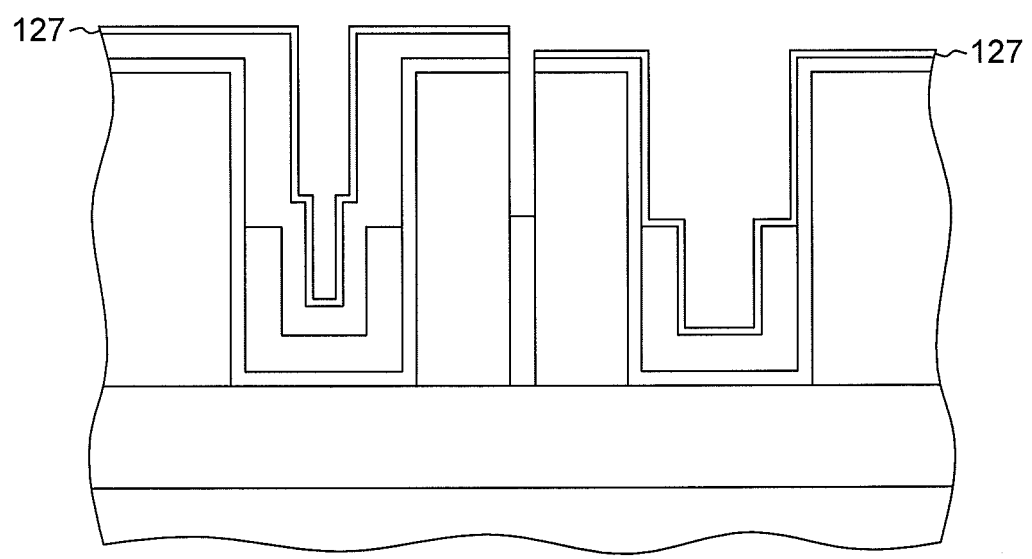
FIG. 4 depicts one example of the structure of FIG. 2 after optionally adding a second conformal barrier layer, in accordance with one or more aspects of the present invention

FIG. 4 depicts one example of the structure of FIG. 2 after optionally adding a second conformal barrier layer 127, in accordance with one or more aspects of the present invention.

Figure 5:
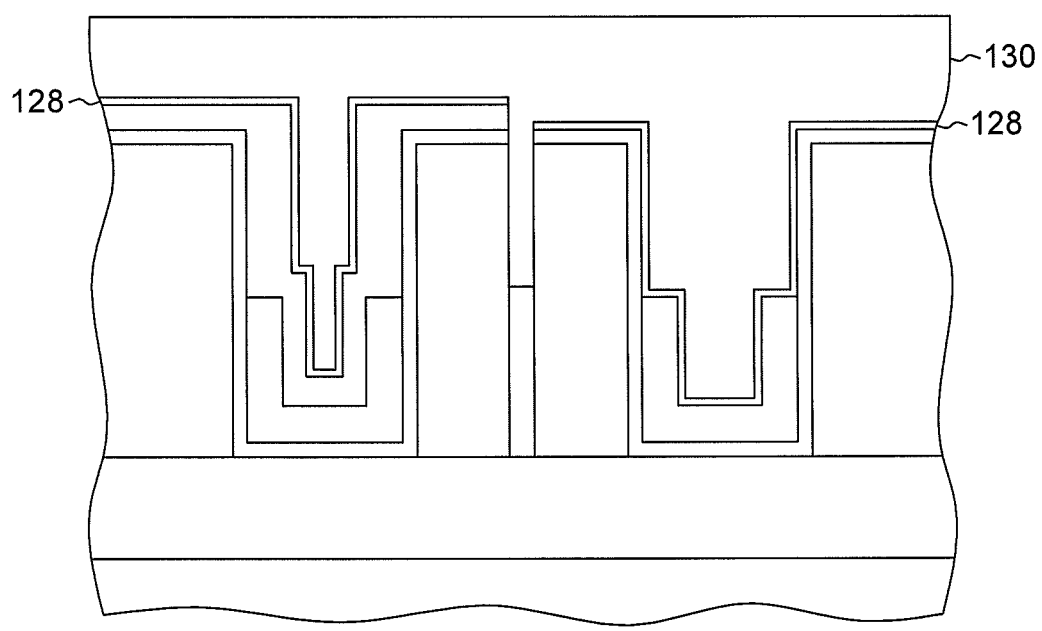
FIG. 5 depicts one example of the three-dimensional structure of FIG. 3 after creating a top layer of work function material over the structure, and filling the gate openings with conductive material, in accordance with one or more aspects of the present invention.

FIG. 5 depicts one example of the three-dimensional structure of FIG. 3 after creating a top layer 128 of work function material over the structure, and filling the gate openings with conductive material 130, in accordance with one or more aspects of the present invention.

In one example, the top layer of work function material may include, for example, a p-type work function material (e.g., TiN), and may be created using, for example, conventional processes and techniques (e.g., Atomic Layer Deposition (ALD) or Chemical Vapor Deposition (CVD) for a deposition process). The conductive material may include, for example, tungsten, and filling the gate openings may be accomplished using, for example, a chemical vapor deposition (CVD) hexafluoride (WF$_6$) process with tungsten. The result of FIG. 5 is that gate structure 108 on the left will have a lower work function (higher Vt for pFET, and lower Vt for nFET) than gate structure 110 on the right.

In a first aspect, disclosed above is a method of co-fabricating semiconductor devices with different threshold (or "turn-on") voltages. The method includes providing a starting semiconductor structure, the structure including a semiconductor substrate, multiple raised semiconductor structures coupled to the substrate, at least two gate structures, each gate structure encompassing a portion of the raised structures and including a gate opening defined by spacers, lined with dielectric material and partially filled with work function material, a portion of the work function material being recessed. The method further includes creating conformal barrier layer(s) in one or more and less than all of the gate openings, filling the gate openings with conductive material, and modifying the work function of at least one and less than all of the filled gate structures.

In one example, modifying the work function may include, for example, penetrating the at least one of the filled gate structures with fluorine. In one example, modifying the work function may further include, for example, creating a wetting layer prior to the penetrating. The material of the wetting layer may include, for example, TiN, tungsten nitride (WN), tungsten carbide (WC) or TiC, which effectively acts as a barrier for the fluorine. In one example, creating the wetting layer may include, for example, choosing a thickness of the wetting layer to achieve a desired fluorine penetration. In one example, where the wetting layer includes TiC, the fluorine concentration in the TiC may be, for example, about $5 \times 10^{21}$/cm$^3$. Note that the middle of the thickness of the TiC wetting layer is the target for fluorine penetration.

In one example, the work function material of the starting structure of the first aspect may include, for example, a n-type work function material.

In one example, the dielectric material of the starting structure of the first aspect, may include, for example, a high-k dielectric. In one example, the high-k dielectric may include, for example, hafnium dioxide.

In one example, creating the conformal barrier layer(s) in the method of the first aspect may include, for example, creating a first conformal barrier layer over the starting structure, recessing a portion of the first barrier layer above the recessed portion of the work function material, and selectively removing the first barrier layer from the at least one and less than all of the at least two gate structures.

In one example, the method may further include, for example, creating a second conformal barrier layer over the remaining first conformal barrier layer.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the starting semiconductor structure comprising a semiconductor substrate, a plurality of fins coupled to the substrate, at least two gate structures encompassing a portion of the fins, the at least two gate structures comprising at least two gate trenches, a conformal dielectric layer covering a bottom and walls of each of the at least two gate trenches, the at least two gate trenches being partially filled over the conformal dielectric layer with work function material, a portion of the work function material being recessed;
creating at least one conformal barrier layer in one or more and less than all of the at least two gate trenches;
filling the at least two gate trenches with conductive material; and
prior to the filling, modifying a work function of the work function material, resulting in different work functions for the at least two gate trenches with and without the conformal barrier layer.

2. The method of claim 1, wherein the work function material of the starting structure comprises a n-type work function material.

3. The method of claim 1, wherein the conformal dielectric layer of the starting semiconductor structure comprises a high-k dielectric.

4. The method of claim 3, wherein the high-k dielectric comprises hafnium dioxide.

5. The method of claim 1, wherein creating the at least one conformal barrier layer comprises:
creating a first conformal barrier layer over the starting semiconductor structure;
recessing a portion of the first conformal barrier layer above the recessed portion of the work function material; and
selectively removing the first conformal barrier layer from the at least one and less than all of the at least two gate structures.

6. The method of claim 5, further comprising creating a second conformal barrier layer over a remainder of the first conformal barrier layer.

7. The method of claim 1, wherein gate trenches with the at least one conformal barrier layer have a lower work function than gate trenches without the at least one conformal barrier layer.

* * * * *